United States Patent [19]
Hebenstreit

[11] 3,974,366
[45] Aug. 10, 1976

[54] INTEGRATED, PROGRAMMABLE LOGIC ARRANGEMENT

[75] Inventor: Ernst Hebenstreit, Munich, Germany

[73] Assignee: Siemens Aktiengesellschaft, Berlin & Munich, Germany

[22] Filed: Sept. 29, 1975

[21] Appl. No.: 617,963

[30] Foreign Application Priority Data
Sept. 30, 1974 Germany............................ 2446654

[52] U.S. Cl................................. 235/152; 307/207; 340/166 R; 340/172.5; 340/173 AM
[51] Int. Cl.[2].................. G11C 15/00; H03K 19/08
[58] Field of Search................. 235/152; 340/172.5, 340/173 FF, 173 AM, 166 R; 307/207, 238

[56] References Cited
UNITED STATES PATENTS

| | | | |
|---|---|---|---|
| 3,566,153 | 2/1971 | Spencer, Jr. .................... | 340/166 R |
| 3,816,725 | 6/1974 | Greer................................ | 235/152 |
| 3,924,243 | 12/1975 | Vermeulen............. | 340/173 AM X |

OTHER PUBLICATIONS

Kent Andres, "MOS Programmable Logic Arrays," A Texas Instruments Application Report, No. CA-158, Oct. 1970, pp. 1-4.
J. E. Elliott et al., "Array Logic Processing," *IBM Technical Disclosure Bulletin*, vol. 16, No. 2, July 1973, pp. 586-587.

*Primary Examiner*—Jerry Smith
*Attorney, Agent, or Firm*—Hill, Gross, Simpson, Van Santen, Steadman, Chiara & Simpson

[57] ABSTRACT

An integrated, programmable logic arrangement includes an AND matrix and an OR matrix which have individual gates. In the AND matrix each input is connected to a control line and via an inverter to another control line for production of a complementary input signal. A selector line and a base line are provided for each gate both in the AND matrix and in the OR matrix and the selector line is connectible to the supply potential. In the AND matrix, in programmed fashion, a switching transistor is provided at the intersection points between a control line and a selector line, or is not so provided, and a switching transistor so arranged at an intersection is connected by its gate terminal to an associated control line, Also, the switching transistor is connected, on the one hand, to an associated selector line of a gate and, on the other hand, to a base line which is connectible to another potential. The difference between the supply potential and the other potential corresponds to the supply voltage. In the OR matrix, in a correspondingly programmed fashion, a switching transistor is provided at an intersection point of a control line and a selector line or is not so provided. A switching transistor so provided is connected by its gate terminal to the associated control line and is connectible, on the one hand, to the selector line of a gate which may be connected to the supply potential and, on the other hand, to a base line which is connectible to ground. In the AND matrix a selector line of a gate is, in each case, connected by way of a pulsed load transistor to the supply potential and the base line of the gate is connectible by way of a pulsed cut-off transistor to the further potential. In the OR matrix, in corresponding fashion, a selector line of a gate is, in each case, connectible via a pulsed load transistor to the supply potential and the base line of the gate is connectible via a pulse cut-off transistor to the further potential. A pulsed flip-flop is arranged, in each case, between an output of the AND matrix and an input of the OR matrix and a pulsed flip-flop is provided, in each case, at an output of an OR matrix.

9 Claims, 4 Drawing Figures

INTEGRATED, PROGRAMMABLE LOGIC ARRANGEMENT

BACKGROUND OF THE INVENTION

1. Field of the Invention

The invention relates to an integrated, programmable logic arrangement of the type which includes an AND matrix and an OR matrix, each matrix being provided with individual gates, and each matrix is programmed by the provision or absence of a switching transistor at the intersections of control lines and selector lines, the control lines of the AND matrix constituting inputs, the selector lines of the OR matrix constituting outputs, and the selector lines of the AND matrix connected to the control lines of the OR matrix.

2. Description of the Prior Art

Integrated, programmable logic arrangements of the type generally described above are well known in the art and are referred to as programmable logic arrays (PLA). These arrays comprise two series-connected, programmable gate collectives, an AND matrix and an OR matrix. Such arrangements are described, for example, in the publication by W. Carr & J. Mize: MOS/-LSI Design and Application, McGraw-Hill Book Co., New York, 1972, pp. 229–258. A known logic arrangement of this type is represented in the first figure of the drawings of the instant case, in which an AND matrix 01 comprises individual gates, each gate in turn comprising parallel-connected switching transistors. In each case, one gate terminal of a switching transistor is connected to a control line. For example, in the AND matrix 01 the switching transistor 014 and 017 form a gate. The switching transistor 014 is connected to the control line 0141 which is itself connected to an input $E_1$. The switching transistor 017 is connected to the control line 0171 which is connected, via an inverter 019, to an input $E_2$. On the one hand, the switching transistor 014 and 017 are connected, via the line 0131 to ground, and, on the other hand, the switching transistor 014 and 017 are connected to a gate line 0111. The supply voltage $U_{DD}$ is applied to the gate line 0111 by way of a load transistor 011.

Individual gates are arranged in a corresponding fashion in the OR matrix 02.

Integrated, programmable logic arrangements of this type have the disadvantage that the gates of the matrices 01 and 02 conduct rest currents in one of the two possible switching states, in which case an increased power loss and an adulteration of the logic level occurs. Also, since the load transistors 011, 012, 021 and 022 cannot be made with a sufficient low-ohmic resistance, charging processes across these load transistors are relatively slow and therefore limit the operative speed of the logic arrangement.

SUMMARY OF THE INVENTION

The primary object of the invention is to avoid the aforementioned disadvantages of the prior art concerning power loss, adulteration of the logic level and the speed of operation.

This object by the provision of an integrated, programmable logic arrangement of the type generally mentioned above which is characterized in that in the AND matrix a selector line of a gate is in each case, connected via a pulsed load transistor to the supply potential, that the base line of the gate is connectible via a pulse cut-off transistor to a further potential, that in the OR matrix, in corresponding fashion, a selector line of a gate is in each case connectible via a pulse load transistor to the supply potential and that the base line of the gate is connectible via a pulse cut-off transistor to the further potential, that a pulsed flip-flop is, in each case, arranged between an output of the AND matrix and an input of the OR matrix, and that a pulse flip-flop is, in each case, provided at an output of the OR matrix.

An essential advantage of the invention resides in the fact that by virtue of a corresponding preliminary charging of the capacitance of the gate lines, the slow switching processes, as required to charge these capacitances in the prior art arrangements, are eliminated. This preliminary charging of the gate capacitances, in accordance with the invention, will be explained in more detail farther along in the description.

Another essential advantage of the arrangement constructed in accordance with the invention consists in that no static shunt currents occur across switching transistors and load transistors and, therefore, the corresponding power loss and the residual voltage, due to such shunt currents, across the switching transistors in the form of interference levels do not occur.

Another essential advantage of the invention further consists in the fact that the logic arrangement of the invention is organized in the manner of a two-stage shift register, wherein the AND matrix represents the first stage and the OR matrix represents the second stage. In this manner, the stage transit times are approximately equal, and one pair of complementary timing signals is sufficient for the entire control unit.

BRIEF DESCRIPTION OF THE DRAWINGS

Other objects, features and advantages of the invention, its organization, construction and operation will be best understood from the following detailed description taken in conjunction with the accompanying drawings, on which.

DESCRIPTION OF THE PREFERRED EMBODIMENTS

Figure 1:
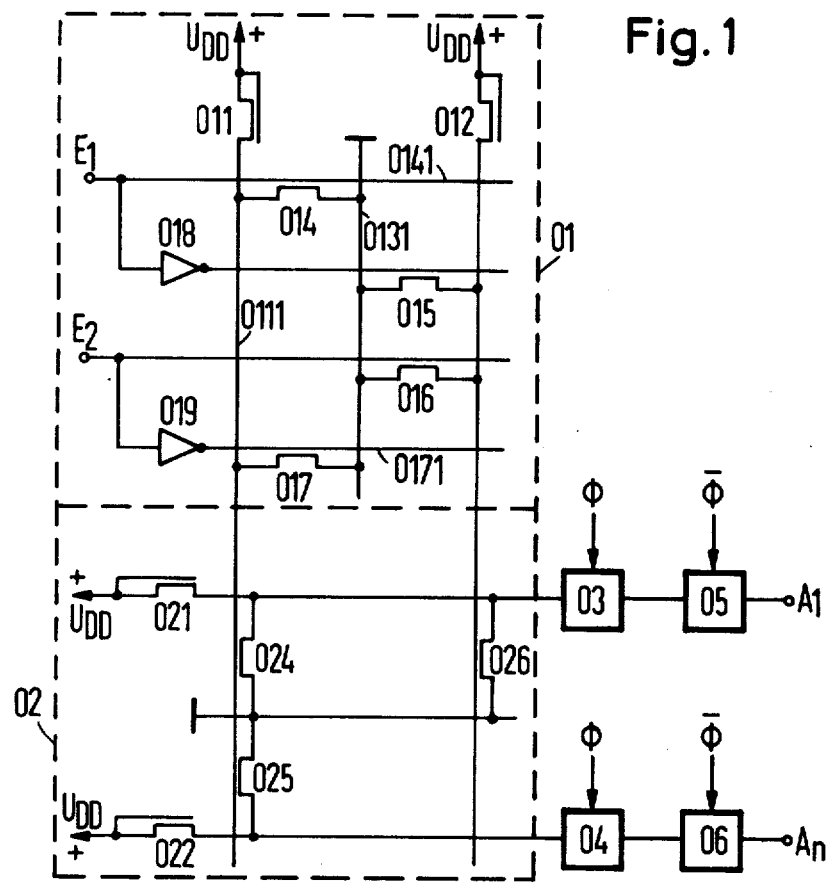
FIG. 1 is a schematic circuit diagram of an integrated, programmable prior art logic arrangement.

The following considerations led to the invention. In the known arrangements of the prior art, the slow switching processes are due to the charging of the gate line capacitances via the resistance of the load transistor. For example, in the case of corresponding linking processes the capacitance of the gate line 0111 must be charged via the resistance of the transistor 011 (FIG. 1). In the present invention, this time-consuming charging process is avoided in that the gate line capacitance is pre-charged via a pulsed load transistor. At the same time, and with the aid of a likewise pulsed cut-off transistor, the ground potential is cut-off from the switching transistors so that no shunt currents flow. In the subsequent linking process the load transistor is blocked and the cut-off transistor is rendered conductive. It is therefore ensured that in the case of at least one conductive switching transistor the already pre-charged gate capacitance is discharged, or otherwise is retained. Therefore, in the linking process only the rapid switching processes can take place across switching transistors.

Figure 2:
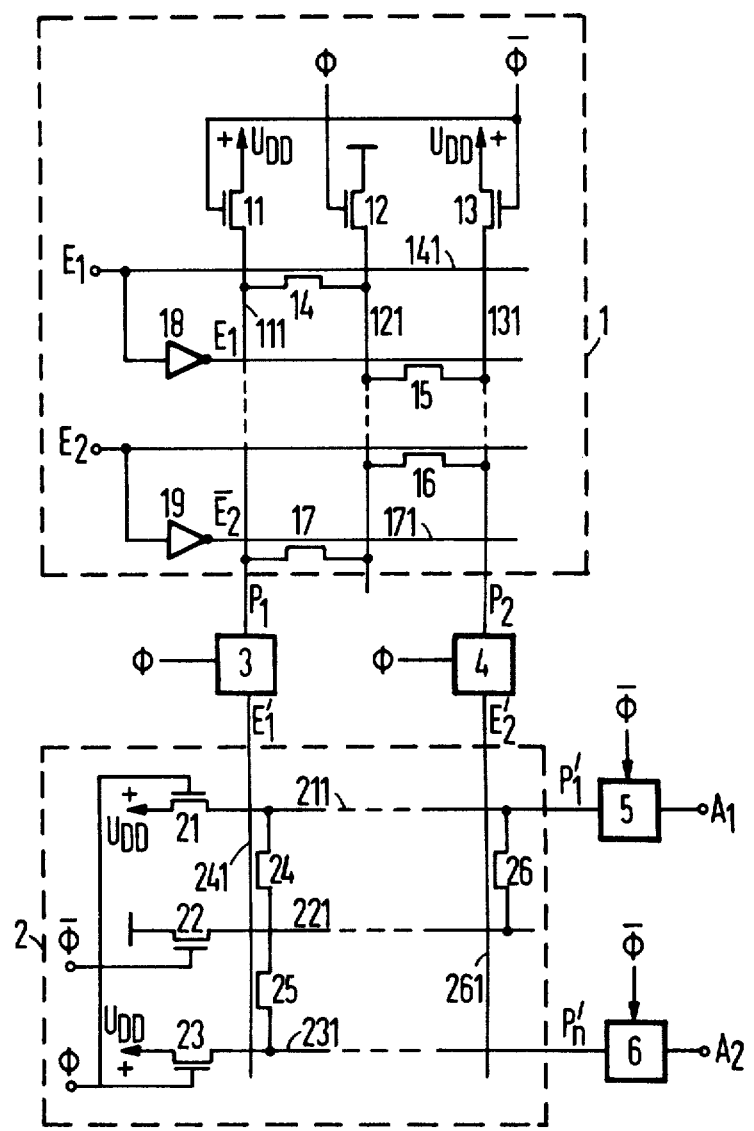
FIG. 2 is a schematic circuit diagram of a logic arrangement constructed in accordance with the invention in the single-channel technique.

FIG. 2 represents a logic arrangement constructed in accordance with the invention in a single-channel technique. For example, the switching transistors 14 and 17 belong to a first gate, and the switching transistors 15 and 16 belong to a second gate. The gate terminal of the switching transistor 14 is connected to a control line 141, and the gate terminal of the switching transistor 17 is connected to a control line 171. On the one hand, the switching transistors of the first gate are connected to a base line 121 and, on the other hand, to an output line 111. The switching transistors of the second gate are connected, on the one hand, to a base line 121 and, on the other hand, to an output line 131. The output lines 111 and 131 are connected, by way of respective load transistors 11 and 13, in the manner illustrated, to the supply potential $U_{DD}$. The load transistors are pulsed, via their gate terminals, by a pulse train $\phi$. The base line 121 is connected, via a cut-off transistor 12, preferably to ground. Here, the cut-off transistor 12 is pulsed by a pulse train $\phi$ connected to its gate terminal. The pulse trains $\phi$ and $\bar{\phi}$ are inverse to one another, which means that the load transistors 11 and 13 are conductive when they cut-off transistor 12 is blocked and vice versa.

Correspondingly, in the OR matrix 2, for example, the switching transistors 24 and 26 belong to a first gate and the switching transistor 25 belongs to a second gate. On the one hand, the switching transistors of a gate are connected to a base line and, on the other hand, to an output line. For example, the switching transistors 24 and 26 of the first gate are connected to a base line 221 and to an output line 211. The switching transistor 25 of the second gate is connected, on the one hand, to the base line 221 and, on the other hand, to an output line 231. The base line 221 is connected preferably to ground potential via a cut-off transistor 22 which may be controlled, via its gate terminal, by the pulse train $\phi$. The output lines 211 and 231 are preferably connected to the supply potential $U_{DD}$ via respective load transistors 21 and 23, which may be controlled via their gate terminals by the pulse train $\phi$. In each case, one gate terminal of a switching transistor is connected to a control line. For example, the switching transistors 24 and 25 are connected, via their gate terminals, to a control line 241 and the switching transistor 26 is connected, via its gate terminal, to a control line 261.

In accordance with the invention, in each case, an output line 111, 131 of the AND matrix 1 is connected via a respective flip-flop 3, 4 to a respective control line 241, 261 of the OR matrix 2. Here, the flip-flops 3 and 4 are pulsed by the pulse train $\phi$.

In each case, an output line 211, 231 of the OR matrix 2 is connected, via a respective flip-flop 5, 6, to a respective output $A_1$, $A_2$. Here, these flip-flops are pulsed by the pulse train $\bar{\phi}$.

It is essential that each of the aforementioned flip-flops have a controllable gate circuit at its input. Preferably, these flip-flops can be conventional stages of master-slave flip-flops. Dynamic storage stages can also be used instead of the flip-flops.

As a result of the symmetrical construction of the arrangement according to the invention, in which one flip-flp stage belongs to each matrix, it is ensured that the stage transit times are equal.

Preferably, all of the transistors of the AND matrix and of the OR matrix are n-channel transistors.

Figure 3:
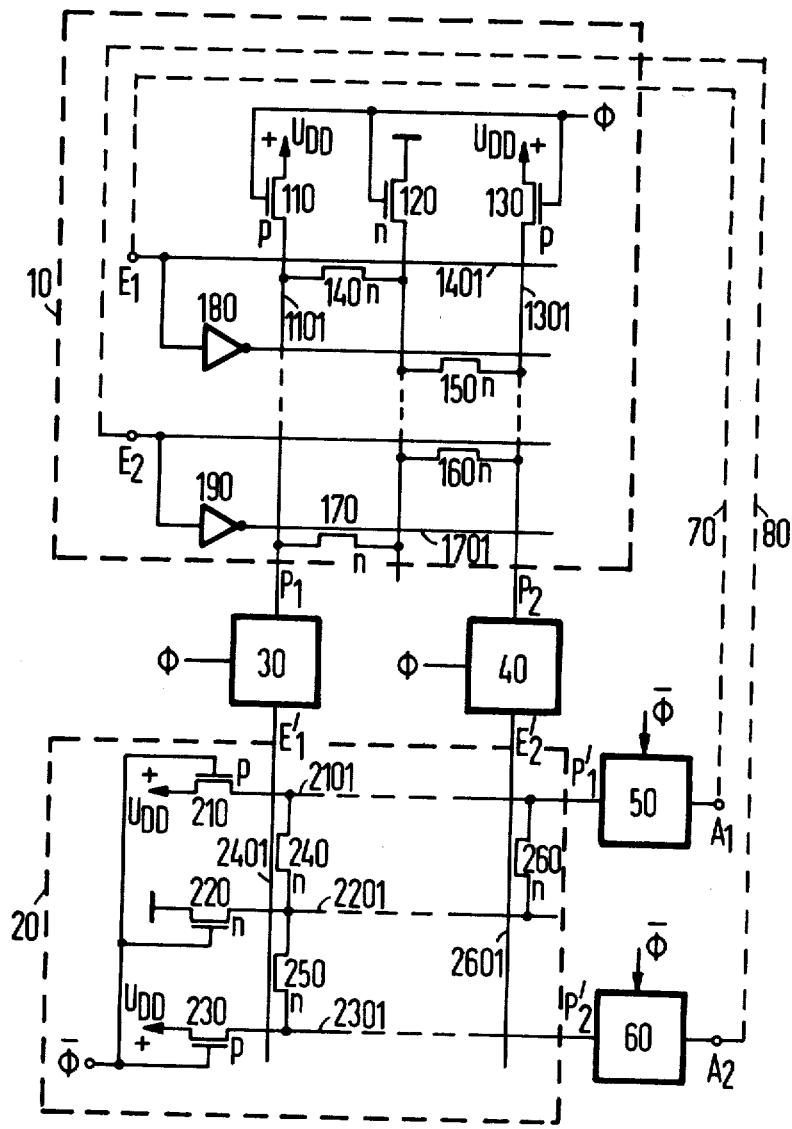
FIG. 3 is a schematic circuit diagram of a logic arrangement constructed in accordance with the invention in the complementary-channel technique.

FIG. 3 illustrates a logic arrangement constructed in accordance with the invention which, considered in respect of the arrangement of the switching elements, is identical to the arrangement of FIG. 2. However, the arrangement in FIG. 3 is designed in a complementary-channel technique. In the AND matrix 10, the load transistors 110 and 130 which are connected to output lines, are, for example, p-channel transistors, and the cut-off transistor 120 and the switching transistors are n-channel transistors. Correspondingly, in the OR matrix 20, the load transistors 210 and 230 which are connected to output lines are p-channel transistors, and the cut-off transistor 220 and the switching transistors are n-channel transistors.

In such an arrangement, the load transistors 110, 130, 120 and 210, 230, 220 which are complementary to one another can be pulsed by a common pulse train $\phi$ and $\bar{\phi}$, respectively.

If, in the AND matrix 10 the signal $\phi$ is equal to 0, the p-channel load transistor is conductive and the n-channel cut-off transistor 120 blocks. This results in the fact that the capacitance of the output line 1101 is pre-charged to the potential $U_{DD}$. If, on the other hand, the signal $\phi$ is of the value $U_{DD}$, the gates of the matrix 10 operate normally, which means that the cut-off transistor 120 is conductive, that the load transistor 110 blocks and that the output $P_1$ is connected to ground when at least one of the switching transistors 140 to 170 of the first gate is conductive. Otherwise, the potential $U_{DD}$ is retained. In the case of a periodic pulse train $\phi$, in each case a charging process and a linking process occur accordingly in each period.

The statements made in respect of the output $P_1$ apply also in corresponding fashion to the output $P_2$ and to the second gate.

If in the OR matrix 20 the signal $\bar{\phi}$ is equal to 0, the p-channel load transistor 210 is conductive and the n-channel cut-off transistor 220 is blocked. Again, this results in the fact that the capacitance of the output line 210 is pre-charged to the potential $U_{DD}$. If, on the other hand, the potential $\bar{\phi}$ is of the value $U_{DD}$, the gates of the matrix 20 operate normally, which means that the cut-off transistor 220 is conductive, that the load transistor 210 blocks, and that the output $P_1'$ is connected to ground when at least one of the switching transistors 240 to 260 of the first gate is conductive. Otherwise, the potential $U_{DD}$ is retained. Therefore, in the case of a periodic pulse train $\phi$, in each case a charging process and a linking process occur in the OR matrix 20 during each period.

Preferably, all of the flip-flops and the pulse transistors are controlled with the same pair of complementary pulse trains $\phi$ and $\bar{\phi}$ in time-synchronism.

The operation of the overall circuit, as illustrated in FIG. 3, is explained as follows. Here, it has been assumed that the input information which arrives at the inputs $E_1$ and $E_2$ likewise emanates from a source pulsed by the complementary pulse trains $\phi$ and $\bar{\phi}$. For example, this is the case even when a feedback of the output signals of the matrix 20 is effected, as illustrated by the broken lines 70 and 80. The input of one of the flip-flops 30, 40, 50 and 60 is open to receive information, when the associated timing signal corresponds to the state $U_{DD}$. In addition, in the 0 state, the input of the flip-flops is blocked and the flip-flops store the last item of information which was received.

Figure 4:
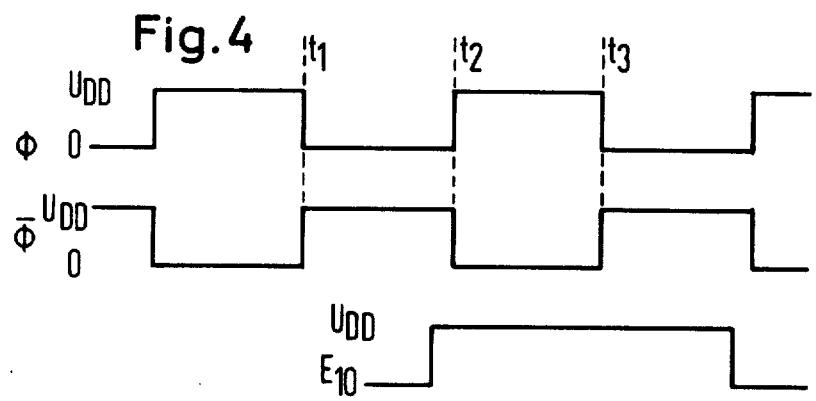
FIG. 4 illustrates a pulse train program for the operation of a logic arrangement constructed in accordance with the invention.

In accordance with FIG. 4, a periodic pulse sequence $\phi$ and $\bar{\phi}$ will be assumed. This means that at the time $t_1$ the masterstages 30 and 40 controlled by the pulse train $\phi$ are blocked at their inputs ($P_1$, $P_2$), and that no exchange of information occurs at these outputs. Simultaneously, at this instant of time, the linking process is initiated for the OR matrix 20. The p-transistors 210 and 230 are blocked and the n-cut-off transistor 220 becomes conductive. If, therefore, one of the transistors 240 to 260 is switched conductive via the control lines 2401 to 2601, the state 0 is initiated at the output $P_1{}'$ of the first gate of the matrix 20. Otherwise, when all of the switching transistors of a gate are blocked, the state $U_{DD}$ which was initiated by the preceding charging process is maintained. Similar circumstances apply to the output $P_2{}'$ and to the gate connected therewith.

Also, at the time $t_1$, the gates of the AND matrix are pre-charged, since $\phi$ is equal to 0, and, as described above, the p-load transistors 110 and 130 are conductive and the n-cut-off transistor blocks. The state $U_{DD}$ (charging process) is instigated at the outputs $P_1$ and $P_2$. However, this information cannot be propagated, since, as also mentioned above, the flip-flops 30 and 40 are blocked at their inputs.

At the time $t_2$, all of the flip-flops 30–60 and the matrices of both stages change operating state, and the linking process is initiated for the AND matrix 10, whereas the charging process is initiated for the OR matrix 20. At this time, all of the items of input information must be present at the inputs $E_1$ to $E_2$ of the AND matrix 10.

At the time $t_3$, the procedure already described for the $t_1$ is repeated, in which case the new information passes to the outputs $A_1$ to $A_2$.

Since the linking process of the one matrix and the charging process of the other matrix take place in synchronism, and since both processes must be concluded before the next operative phase begins, an optimum operative speed is attained when the charging processes are equal to or shorter than the duration of the associated linking processes. This can be readily achieved by a suitable dimensioning of the conductivities of the pulsed transistors.

In a further development of the invention, the transistors 110, 130, 210 and 230 are connected in parallel with highly ohmic resistors, which, however, do not impair the operation of the circuit and the above-described advantages. In the case of a state $U_{DD}$ as a linking result, in which case the gate output is highly ohmic, these resistors provide a determinate potential at the output and the discharge of the line capacitances is prevented.

Preferably, the logic arrangement of the invention is constructed in a MIS technique, in particular in a MOS technique on an insulating substrate or in solid silicon.

Although I have described my invention by reference to particular illustrative embodiments thereof, many changes and modifications of the invention may become apparent to those skilled in the art without departing from the spirit and scope of the invention. I therefore intend to include within the patent warranted hereon all such changes and modifications as may reasonably and properly be included within the scope of my contribution to the art.

I claim:

1. An integrated programmable logic arrangement comprising:
   an AND matrix and an OR matrix, each matrix including individual logic gates;
   each of said AND and OR matrices including a plurality of control lines, a plurality of selector lines intersecting said control lines, a plurality of base lines, a plurality of switching transistors at selected intersections of said control lines and said selector lines, each of said switching transistors connected across an associated selector line and base line and including a gate terminal connected to the associated control line, a plurality of load transistors connected between a respective selector line and a supply potential and including a gate terminal for receiving an operating pulse train and a plurality of cut-off transistors connected between a respective base line and a reference potential and including a gate terminal for receiving an operating pulse train;
   a plurality of first data storage circuits, each including a data input connected to a respective AND matrix selector line, a data output connected to a respective OR matrix control line, and a timing input for receiving an operating pulse train; and
   a plurality of second data storage circuits, each including a data output for the logic arrangement, a data input connected to a respective OR matrix selector line, and a timing input for receiving an operating pulse train which is anti-phase and time-synchronous with the pulse train received by said first data storage circuits.

2. The logic arrangement of claim 1, wherein each first data storage circuit comprises a flip-flop.

3. The logic arrangement of claim 1, wherein each first data storage circuit comprises a dynamic storage element.

4. The logic arrangement of claim 1, wherein each second data storage circuit comprises a flip-flop.

5. The logic arrangement of claim 1, wherein each second data storage circuit comprises a dynamic storage element.

6. The logic arrangement of claim 1, wherein said logic arrangement is constructed in a single channel structure wherein the gate terminals of said load transistors of a matrix are connected together to receive a pulse train that is anti-phase and time-synchronous with the pulse train received by said cut-off transistors of the same matrix.

7. The logic arrangement of claim 1, wherein said logic arrangement is constructed in a complementary channel structure wherein said gate terminals of said load and cut-off transistors are connected together in said AND matrix to receive a pulse train, said gate terminals of said load and cut-off transistors are connected together in said OR matrix to receive a pulse train that is anti-phase and time-synchronous with the pulse train received by the gate terminals in said AND matrix.

8. The logic arrangement of claim 1, comprising high ohmic resistors connected in parallel with respective ones of said load transistors in each of said matrices.

9. The logic arrangement of claim 1, wherein said arrangement is constructed in a MIS structure.

* * * * *